(12) United States Patent
Gerlach et al.

(10) Patent No.: US 6,949,756 B2
(45) Date of Patent: Sep. 27, 2005

(54) SHAPED AND LOW DENSITY FOCUSED ION BEAMS

(75) Inventors: Robert L. Gerlach, Portland, OR (US);
Mark W. Utlaut, Scappoose, OR (US);
Paul P. Tesch, Portland, OR (US);
Richard J. Young, Portland, OR (US);
Clive D. Chandler, Portland, OR (US);
Karl D. van der Mast, Portland, OR (US)

(73) Assignee: FEI Company, Hillsboro, OR (US)

( * ) Notice: Subject to any disclaimer, the term of this patent is extended or adjusted under 35 U.S.C. 154(b) by 462 days.

(21) Appl. No.: 09/765,806

(22) Filed: Jan. 19, 2001

(65) Prior Publication Data

US 2001/0045525 A1 Nov. 29, 2001

Related U.S. Application Data

(60) Provisional application No. 60/177,518, filed on Jan. 21, 2000.

(51) Int. Cl.[7] .................. G01N 23/00; G21K 7/00; G21K 5/10; A61N 5/00; G21G 5/00
(52) U.S. Cl. .............. 250/492.21; 250/492.2; 250/492.1; 250/306; 250/307; 250/309
(58) Field of Search ................ 250/306, 307, 250/309, 492.1, 492.2, 492.21, 492.22; 219/229, 121.12; 204/298.36; 216/66; 427/554

(56) References Cited

U.S. PATENT DOCUMENTS

| | | | |
|---|---|---|---|
| 4,609,809 A | 9/1986 | Yamaguchi | 219/121 EM |
| 4,634,871 A | 1/1987 | Knauer | 250/398 |
| 4,661,709 A | 4/1987 | Walker | 250/492.2 |
| 4,694,178 A | 9/1987 | Harte | 250/396 |
| 4,698,236 A | * 10/1987 | Kellogg et al. | 427/526 |
| 4,724,359 A | * 2/1988 | Roussin | 315/15 |
| 4,820,898 A | 4/1989 | Slingerland | 219/121.12 |
| 4,874,460 A | 10/1989 | Nakagawa | 156/626 |
| 4,876,112 A | 10/1989 | Kaito et al. | 427/38 |
| 4,894,549 A | 1/1990 | Stengl | 250/492.2 |
| RE33,193 E | * 4/1990 | Yamaguchi et al. | 250/309 |
| 5,051,556 A | 9/1991 | Sakamoto | 219/121.25 |
| 5,061,850 A | * 10/1991 | Kelly et al. | 250/306 |
| 5,093,572 A | 3/1992 | Hosono | 250/310 |
| 5,120,925 A | * 6/1992 | Ohnishi et al. | 219/121.12 |

(Continued)

FOREIGN PATENT DOCUMENTS

| | | | |
|---|---|---|---|
| DE | 3910054 A1 | 10/1990 | H01J/37/30 |
| EP | 0257685 B1 | 1/1991 | H01J/37/317 |
| EP | 0 927 880 A1 | 7/1998 | H01J/37/20 |
| JP | 6169125 | 4/1986 | H01J/37/305 |
| WO | WO0075954 | 12/2000 | H01J/37/317 |

OTHER PUBLICATIONS

Bauer, E., Koziol, C., Lilienkamp, G., Schmidt, T., "Spectromicroscopy in a Low Energy Electron Microscope," *Journal of Electron Spectroscopy and Related Phenomena 84* (1997) pp 201–209.

(Continued)

*Primary Examiner*—Frank G. Font
*Assistant Examiner*—Mary El-Shammaa
(74) *Attorney, Agent, or Firm*—Michael D. Scheinberg

(57) ABSTRACT

A method and apparatus for providing a shaped ion beam having low current density and sharp edges. The low current density and sharp edges eliminate the problem of overmilling, while permitting rapid ion beam processing. One method of producing the shaped beam is by using a two lens system, the first lens imaging the source onto the plane of the second lens and the second lens forming an image of the aperture onto the target plane. Another method is to greatly underfocus a chromatic aberration limited beam. Large beams having uniform current density and sharp edges can be produced. A knife edge beam, having a sharp edge can also be produced.

29 Claims, 9 Drawing Sheets

U.S. PATENT DOCUMENTS

| | | | | |
|---|---|---|---|---|
| 5,126,287 A | * | 6/1992 | Jones | 438/20 |
| 5,149,974 A | | 9/1992 | Kirch et al. | 250/492.2 |
| 5,151,605 A | * | 9/1992 | Politiek et al. | 250/492.2 |
| 5,188,705 A | | 2/1993 | Swanson | 156/643 |
| 5,376,791 A | | 12/1994 | Swanson et al. | 250/309 |
| 5,389,196 A | * | 2/1995 | Bloomstein et al. | 216/66 |
| 5,435,850 A | | 7/1995 | Rasmussen | 118/726 |
| 5,524,018 A | * | 6/1996 | Adachi | 372/98 |
| 5,574,280 A | | 11/1996 | Fujii et al. | 250/309 |
| 5,583,344 A | * | 12/1996 | Mizumura et al. | 250/492.21 |
| 5,827,786 A | | 10/1998 | Puretz | 438/789 |
| 5,852,297 A | * | 12/1998 | Ishitani et al. | 250/492.21 |
| 5,916,424 A | * | 6/1999 | Libby et al. | 204/298.36 |
| 5,945,677 A | | 8/1999 | Leung | 250/396 |
| 5,952,658 A | * | 9/1999 | Shimase et al. | 250/309 |
| 5,973,295 A | * | 10/1999 | Corbin et al. | 219/229 |
| 6,011,269 A | | 1/2000 | Veneklasen | 250/492.23 |
| 6,042,738 A | * | 3/2000 | Casey et al. | 216/66 |
| 6,048,588 A | * | 4/2000 | Engelsberg | 427/554 |
| 6,118,129 A | * | 9/2000 | Oae et al. | 250/492.22 |
| 6,128,134 A | * | 10/2000 | Feldman et al. | 359/565 |
| 6,177,670 B1 | * | 1/2001 | Sugiyama | 250/307 |
| 6,274,877 B1 | * | 8/2001 | Muraki | 250/492.23 |
| 6,277,542 B1 | * | 8/2001 | Okino et al. | 430/296 |
| 6,303,932 B1 | * | 10/2001 | Hamamura et al. | 250/309 |
| 6,414,307 B1 | * | 7/2002 | Gerlach et al. | 250/309 |

OTHER PUBLICATIONS

Edinger, Klaus and Kraus, Thomas, "Modeling of Focused Ion Beam Induced Surface Chemistry," *Journal of Vacuum Science Technology* B 18(6), Nov./Dec. 2000; pp 3190–3193.

Lee, Y. ,et al. "Development of Ion Sources for Ion Projection Lithography" *Journal of Vacuum Science Technology*, B 14(6), Nov./Dec. 1996; pp 3947–3950.

Orloff, J., Li, J. Z., Sato, M., "Experimental Study of a Focused Ion Beam Probe Size and Comparison with Theory," *Journal of Vacuum Science Technology*, B 9 (5), Sep./Oct. 1991, pp 2609–2612.

Orloff, J., and Swanson, L. W., "Some Considerations on the Design of a Field Emission Gun for a Shaped Spit Lithography System," *Optik*, vol. 61, No. 3 (1982), pp 237–245.

Orloff, J., and Sudraud, Pierre, "Design of a 100 kV, High Resolution Focused Ion Beam Column with a Liquid Metal Ion Source" Microelectronic Engineering 3 (1985)pp. 161–165.

Sato, M., and Orloff, J. "A Method for calculating the Current Density of Charged Particle Beams and the Effect of Finite Source Size and Spherical and Chromatic Aberrations on the Focusing Characteristics," *Journal of Vacuum Science Technology*, B, vol 9, No. 5, Sep./Oct. 1991; pp 2602–2608.

Stickel, W., "Simulation of Columb Interactions in Electron Beam Lithography Systems–A Comparison of Theoretical Models," Papers from the $42^{nd}$ International Conference on Electron, Ion, and Photon Beam Technology and Nanofabrication, May 26–29, 1998.

Slingerland, H. N., "Optimization of a Chromatically Limited Ion Microprobe," *Microelectronic Engineering 2* (1984) 219–226.

Tuggle, D.W., Swanson, L.W., and Gesley, M.A., "Current Distribution in a Chromatically Limited Electron Microprobe", J. Vac. Sci. Technol. B4 (1) Jan./Feb. 1986 pp. 131–134.

Hawkes, P.W. and Kasper, E., *Principles of Electron Optics*, vol. 2., Applied Geometrical Optics, Academic Press, 1989: Chapters 47, 48. pp 971–1003.

"Plasma Ion Source–ECR microwave plasma ion source," http://www.tectra.de/plasma–ion–source.htm, Feb. 18, 2000 Contact: Dr. Christian Bradley, tectra GmbH, Reuterweg 65, D–60323 Frankfurt/M.

Slingerland, H.N., Barth, J.E., Koets, E. Kramer, J. van der Mast, K.D., "Proposal for a Second Generation IBPG," Proceedings Microcircuit Engineering Conference, 1984, *Microcircuit Engineering*, 1985, pp. 381–387.

Slingerland, H.N., Bohlander, J.H., van der Mast, K.D., Koets, E., "Progress on the Delft Ion Beam Pattern Generator," *Microelectronic Engineering 5* (1986), Elsevier Science Publishers B.V. (North Holland), pp 155–161.

Van der Mast, K.D., Jansen, G.H., Barth, J.E., "The Shower–Beam Concept" *Microelectronic Engineering 3* (1985), Elsevier Science Publishers B.V. (North Holland), pp 43–51.

Van der Mast, K.D., Pijper, F. J., and Barth, J.E., "A Flexible Beamshaper," *Microelectronic Engineering 5* (1986), Elsevier Science Publishers B.V. (North Holland), pp 115–122.

Vijgen, L., "Coulomb Interactions in Focused Ion Beam Columns," 3 Beams Conference 1992.

Vijgen, L.J., and Kruit, P., "Coulomb Interactions in a Shaped Ion Beam Pattern Generator," *J. Vac. Sci. Technol. B* 10(6), Nov./Dec. 1992, pp. 2809–2813.

Edinger, Klaus, Yun, Victor, Melngaillis, John and Orloff, Jon, "Development of a High Brightness Gas Field Ion Source," *J. Vac. Sci. Technol. b*(6), Nov./Dec. 1997, pp. 2365–2368.

Guharay, S.K., Wang, W., Dudnikov, V.G., Reiser,M. Orloff, J. And Meingaillis, J., "High–brightness Ion Source for Ion Projection Lithography," *J. Vac. Sci. Technol. B*(6), Nov./Dec. 1996, pp. 3907–3910.

* cited by examiner

SHAPED AND LOW DENSITY FOCUSED ION BEAMS

RELATED APPLICATIONS

This application claims priority from U.S. Provisional Patent Application No. 60/177,518, filed Jan. 21, 2000.

TECHNICAL FIELD

The invention relates to Focused Ion Beam (FIB) systems for milling, etching or depositing materials on surfaces.

BACKGROUND OF THE INVENTION

Because of their ability to deposit material or etch microscopic features with great precision, FIB systems are used in a variety of applications, including processing integrated circuits, trimming thin film heads for disk drives, processing Micro Electro Mechanical Systems (MEMS), and preparing samples for viewing in Transmission Electron Microscopes (TEMs). These applications and others continually demand increased speed and accuracy for creating ever smaller, more elaborate, microscopic features on solid surfaces. In many applications, many cubic microns of material must be removed or added in seconds or minutes.

The standard methods for creating microscopic features involve scanning a finely focused ion beam in a pattern over the target surface to mill, etch, or deposit material. Milling involves the direct removal of surface material by the impact of ions in a process called sputtering. In FIB deposition, a gas, typically including organometallic compounds, is directed toward the impact point of the FIB on the target surface. The gas decomposes in the presence of the ion beam to add material to the target surface. Ion beam assisted deposition processes are described, for example, in U.S. Pat. No. 4,876,112 to Kaito et al. for "Process for Forming Metallic Patterned Film," and U.S. Pat. No. 5,827,786 to Puretz for "Charged Particle Deposition of Electrically Insulating Films." FIB-enhanced etching uses a reactive gas in combination with the FIB to increase the number of surface atoms removed by each impinging ion. Such a process is described, for example, in U.S. Pat. No. 5,188,705 to Swanson et al. for "Method of Semiconductor Device Manufacture." In deposition and etching, the reactive gas is adsorbed onto the specimen surface and reacts in the presence of the ion beam. The rate of material removal or deposition depends on the number of ions striking the target surface, the rate at which gas molecules are adsorbed by the surface, and the number of atoms removed or deposited by each ion.

To produce smaller features, users have demanded ever higher resolution of FIB systems. Higher resolution implies a smaller diameter ion beam, often on the order of one tenth of a micron or less. Small diameter ion beams are typically Gaussian shaped beams produced by forming an image of the ion source on the target surface. Another method of forming small diameter beams, used in ion beam lithography, includes forming an image of an aperture onto the target. Such aperture imaging techniques are described, for example, in H. N. Slingerland, "Optimization of a Chromatically Limited Ion Microprobe," Microelectronic Engineering 2, pp. 219–226 (1984) and J. Orloff and L. W. Swanson, "Some Considerations on the Design of a Field Emission Gun for a Shaped Spot Lithography System," Optik, 61, No. 3, pp. 237–245 (1982). Such small diameter beams typically contain fewer ions, that is, have a lower beam current, than larger diameter beams. The rate at which material is etched or deposited by such beams is reduced because the total number of ions in the beam is reduced.

With improvements in ion beam producing technology, the beam current density, that is, the current per unit area, has been increased. As the ion beam dwells on each surface site or pixel in its scan pattern, the adsorbed gas molecules are reacted and removed by the high current density beam faster than they can be replenished by the broadly aimed gas jet. This phenomena is known as "overmilling" and applies to both FIB etching and depositing when the gas flux is insufficient to support the ion flux. This extensive gas removal makes the ion beam induced etch or deposition less efficient than if a higher density of adsorbed molecules were present on the surface. In deposition, the low density of the adsorbed gas not only reduces the deposition rate, but also some of the material already deposited may be etched away by the ion beam.

The FIB deposition rate or FIB enhanced etch rate may be limited by either the beam current at the required resolution or the supply of gas molecules. Platinum deposition is a particularly difficult case, where the beam current, and correspondingly the current density, must be limited to prevent overmilling of the adsorbed platinum-organic material.

Because the gas jet is much broader than the sub-micron ion beam, merely increasing the flow of gas toward the specimen is in some cases insufficient to provide an adequate supply of gas molecules adsorbed near the impact point of the ion beam. Moreover, most of the gas injected into the vacuum chamber is not reacted. The gases used in FIB etching and deposition are often corrosive, and unreacted gas molecules, which increase as the flow rate is increased, can degrade components in the vacuum system. Large increases in the gas flow rate would also adversely affect the vacuum required to maintain the ion beam.

One solution to the overmilling problem is to reduce the beam current. This solution reduces the rate of deposition or etching and results in unacceptably long processing times, particularly when a large amount of material is to be deposited or etched.

Another solution to the overmilling problem is to increase the scanning rate, that is, decrease the dwell time of the ion beam at each surface pixel in the scan pattern to move the beam to a new position before the adhered gas is exhausted. There are physical limits, however, to how fast the beam can be accurately scanned. Because the gallium ions in the beam typically travel at about three tenths of a millimeter each nanosecond and the ion column deflection plates are tens of millimeters long, the time for the ions to traverse the deflection plates becomes significant at short dwell times and limits the scan speed. Currently, the minimum pixel dwell time used is about one hundred nanoseconds. Thus, with some gases the ion beam cannot be scanned sufficiently fast to change locations before the adhered gas molecules are extensively reacted.

Another solution is to use a weakly defocused ion beam system that produces a broader, lower current density beam. Such beams cannot, however, produce the sharp edges and high resolution required in modern applications. The one dimensional current density profile (current density along a single axis through the center of the beam) of most focused ion beams is approximately Gaussian, or bell shaped. Most of the ions are in a center portion of the beam and the number of ions decreases gradually towards the beam edges. This non-uniform beam distribution causes uneven etching and deposition. The broad beam has a broadly tapering edge that results in unacceptably sloped, rather than sharp, vertical edges on etched or deposited features.

Thus, a solution to the overmilling problem that provides high resolution and high processing rate is required.

SUMMARY OF THE INVENTION

An object of the invention is to increase the rate of focused ion beam deposition and etching.

Another object of the invention is to increase the rate of focused ion beam deposition and etching without degrading edge resolution.

Yet another object of the invention is to provide an ion beam having a current density that is uniform and sufficiently low to reduce overmilling and a current sufficiently high for efficient processing.

Still another object of the invention is to increase the speed of deposition or etching over medium to large areas.

Yet a further object of the invention is to provide a large size ion beam having a high beam current, low beam current density, and high edge resolution.

Still a further object of the invention is to provide ion beams having particular shapes, such as rectangular, customized for specific applications.

In accordance with the present invention, a shaped ion beam having a relatively low current density and sharp edge resolution is produced. The "shape" of a beam refers to its current density over a cross-sectional area. If for example, we choose the half maximum current density as our reference, then the beam shape is the shape of the half current density contour line in the two dimensional current density distribution or contour. Thus the shape of a beam is different at different points along its path. By "shaped ion beam" is meant a beam having a non-round, two-dimensional current density contour. The shape of a focused ion beam can be determined by milling a surface such as a silicon wafer with a non-scanning beam and observing the shape of the spot pattern using a SEM (Scanning Electron Microscope).

The current density of the shaped ion beam can be made sufficiently low that the etching or deposition rate is not limited by the exhaustion of the adsorbed gas molecules. The overall beam current of a shaped ion beam can be made sufficiently high to significantly increase the etch and deposition rate compared to that of conventional, unshaped beams. In addition, the edge resolution of some geometric feature aspect of the shaped beam is sufficiently sharp to produce features comparable to those produced by a conventional high resolution unshaped beam. In some embodiments, the shaped beam has a size or diameter much larger than that of an unshaped beam and has a substantially uniform current density profile with sharp edge resolution. Such a beam can be stepped across a target surface to produce uniform etching or deposition over a large area.

A focused ion beam system incorporating the invention includes an ion beam column positioned in a vacuum system for directing an ion beam for impinging upon a target. The ion beam column includes accelerating electronics and scanning electronics and typically includes a secondary electron or ion detecting and imaging system, as well as a gas injection system for supplying a gas for depositing material on or etching the target.

In one preferred embodiment, referred to as the "aperture imaging" embodiment, the ion column provides at the target a demagnified image of an aperture. In this embodiment, the chromatic and spherical aberrations are quite low, and the finite source size does not significantly degrade the edge resolution of the shaped beam. The major remaining contributors to the beam edge resolution are the edge roughness of the aperture and the beam interactions. Also in this embodiment, the shaped beam size is relatively independent of the focus condition, although the beam edge resolution does depend upon the focus.

Another preferred embodiment, referred to as the defocusing embodiment, produces a large, strongly defocused shaped beam, preferably rectangular or square, with a nearly uniform beam density. The strong defocusing can reduce the current density by orders-of-magnitude, even with dramatically increased total beam current. The defocusing method preferably uses a rectangular or square shaping aperture before or after the final lens. Under these conditions, large rectangular beams, having sides on the order of microns, can be produced with relatively sharp edges. The size of the rectangular beam depends upon the amount of beam defocus; larger defocus gives larger beams. The defocus method for shaped beams allows larger demagnification of the beam formed by the shaping aperture in a short column and, therefore, is more suitable for smaller diameter beams. However, it has larger aberration contributions to the beam size, and the shaped beam size depends upon the amount of beam defocus.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. It should also be realized by those skilled in the art that various embodiments of the invention can be customized for different applications and that not all objects of the invention will be accomplished in every embodiment.

BRIEF DESCRIPTION OF THE DRAWINGS

For a more complete understanding of the present invention and the advantages thereof, reference is now made to the following descriptions taken in conjunction with the accompanying drawings, in which:

FIG. 2A shows on the right side rays from a point source being imaged to the center of the second lens and shows on the left side rays from an extended source which graze the shaping aperture and pass through the second lens. FIG. 2B shows the effects of chromatic and spherical aberrations on the rays on the left and right sides, respectively.

FIG. 4B is with substantial spherical aberrations.

FIG. 5A is for a target placed at Z=0; FIG. 5B is for the disk of least confusion target placement; and FIG. 5C is for a large negative Z, where the beam is relatively uniform in current density.

DETAILED DESCRIPTION OF PREFERRED EMBODIMENTS

In accordance with preferred embodiments of the present invention, an ion optical column in a focused ion beam system produces a shaped ion beam having one or more desirable geometric feature, such as a straight edge having sharp edge resolution. The ion optical column is implemented in a focused ion beam system as described in FIG. 1.

Focused Ion Beam System Description

Figure 1:
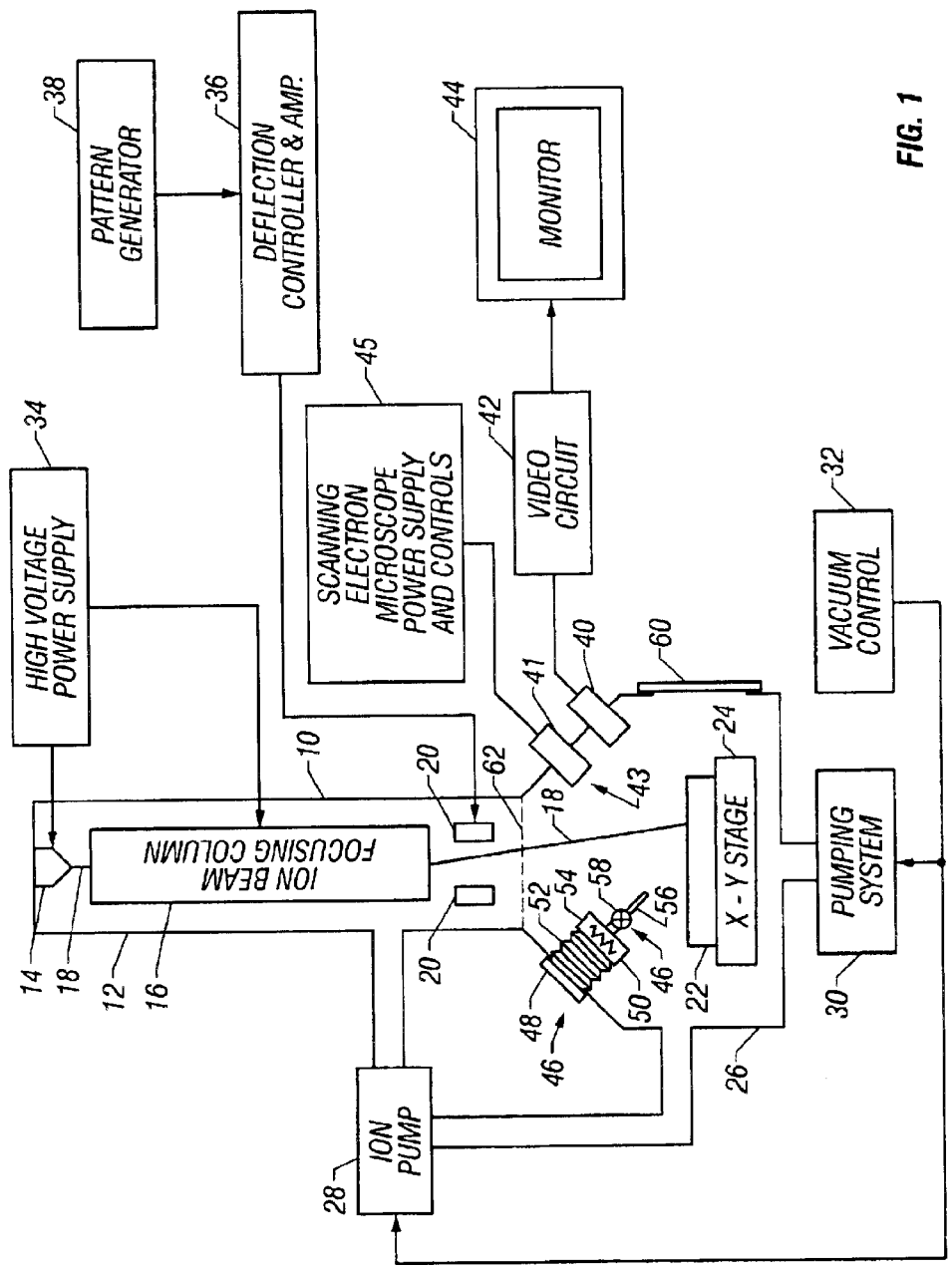
FIG. 1 shows a focused ion beam system in which a shaped ion beam can be produced and applied.

In FIG. 1, an evacuated envelope 10 includes an upper neck portion 12 within which are located a liquid metal ion source 14 and a focusing column 16 which includes extractor electrode means and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32.

High voltage power supply 34 is connected to liquid metal ion source 14 as well as to appropriate electrodes in focusing column 16 for forming an approximately 30 keV ion beam 18 and directing the same downwardly. Deflection controller and amplifier 36, operated in accordance with a prescribed pattern such as a raster pattern provided by pattern generator 38, is coupled to deflection plates 20 whereby beam 18 may be controlled to trace out a corresponding pattern on the upper surface of sample 22. In some systems the deflection plates are placed before the final lens, as is well know in the art.

The source 14 typically provides a metal ion beam of gallium, although other ion sources, such as a multicusp or other plasma ion source, can be used. The source typically is capable of being focused into a sub one-tenth micron wide beam at sample 22 for either modifying the surface 22 by ion milling, enhanced etch, material deposition, or for the purpose of imaging the surface 22. An electron multiplier 40 used for detecting secondary emission for imaging is connected to video circuit and amplifier 42, the latter supplying drive for video monitor 44 also receiving deflection signals from controller 36.

A gas source 46 is located inwardly of the side of chamber 26 by translation device 48 adapted for positioning said source via support means within bellows 52. U.S. Pat. No. 5,435,850 to Rasmussen for a "Gas Injection System" assigned to the assignee of the present invention discloses an apparatus for introducing and directing gaseous vapor toward sample 22. Source 46 includes a reservoir 50 and a heater 54, which may comprise a membrane type heater and which may be used for raising the temperature of a compound within reservoir 50 to a temperature for providing a suitable vapor pressure as hereinafter more fully disclosed. A transfer tube or nozzle 56 comprising a capillary tube provided by a hypodermic needle extends from reservoir 50 and is connected thereto via control valve 58 adapted for releasing gaseous vapor. The nozzle is extended and translated in orthogonal directions substantially perpendicular to its axis employing translation apparatus 48, so that gaseous vapor can be aimed directly toward a region on the top surface of sample 22.

A door 60 is opened for inserting sample 22 on stage 24 which may be heated, and also for servicing the reservoir 50. The door is interlocked so that it cannot be opened if the temperature in reservoir 50 is substantially above room temperature. A gate valve, schematically illustrated at 62, is closed before door 60 can be opened to seal off the ion source and focusing column apparatus.

When reservoir 50 is raised to a desired temperature for vaporizing the compound within reservoir 50, valve 58 may be opened by withdrawing an actuator rod from outside the apparatus to open and regulate the position of valve plunger, while the nozzle 56 is directed towards the desired area of the sample. Bellows 52 accommodates movement of the nozzle assembly and reservoir relative to the sample without affecting the vacuum within chamber 26.

The vacuum control system along with the heater of gaseous vapor source 46 are operated to provide an appropriate vapor pressure condition for establishing a gaseous vapor flux in chamber as directed toward substrate 22 for etching or depositing material. To establish a given gaseous flux, the reservoir is heated to a predetermined temperature.

The high voltage power supply provides an appropriate acceleration voltage to electrodes in ion beam column 16 for energizing and focusing ion beam 18. When it strikes the sample having condensed gaseous vapor adhered thereupon, the ion beam provides energy for initiating a reaction between the gaseous compound and the substrate and for either enhanced etching of or material deposition upon the sample.

Deflection controller and amplifier 36 causes the ion beam to be deflected in a desired pattern for etching sample 22. Considerations regarding deflection speed, loop time, etc. are well understood by those skilled in the art.

As hereinbefore mentioned, the vacuum system provides a vacuum of between approximately $1 \times 10^{-7}$ Torr and $5 \times 10^{-4}$ Torr within chamber 26. With emission of gaseous vapor, the chamber background pressure is suitably about $1 \times 10^{-5}$ Torr. In an exemplary embodiment, the gaseous source 46 is heated to a temperature for providing an appropriate gaseous flux via the capillary tube of the hypodermic needle, while the metal ion source and focusing column are suitably controlled for generating a corresponding appropriate ion flux. Skilled persons can readily determine appropriate pressures and gas flows for any particular application.

Two preferred embodiments of an ion beam optical column 16 in accordance with the invention are described below.

Aperture Imaging Embodiment

The first preferred embodiment is referred to as the "aperture imaging" embodiment. The aperture imaging embodiment uses a two-lens ion focusing column, the first lens forming an image of the ion source at or near the plane of the second lens and the second lens forming an image on the target plane of a shaping aperture placed between the first and second lenses. Skilled persons will understand that the lenses and other "optical" elements used with focused ion beams use electrostatic or magnetic fields to control ions in the beam, and that the optical elements are controlling a stream of ions, not light. Also, the designs may include only one or up to several lenses.

Figure 2A:
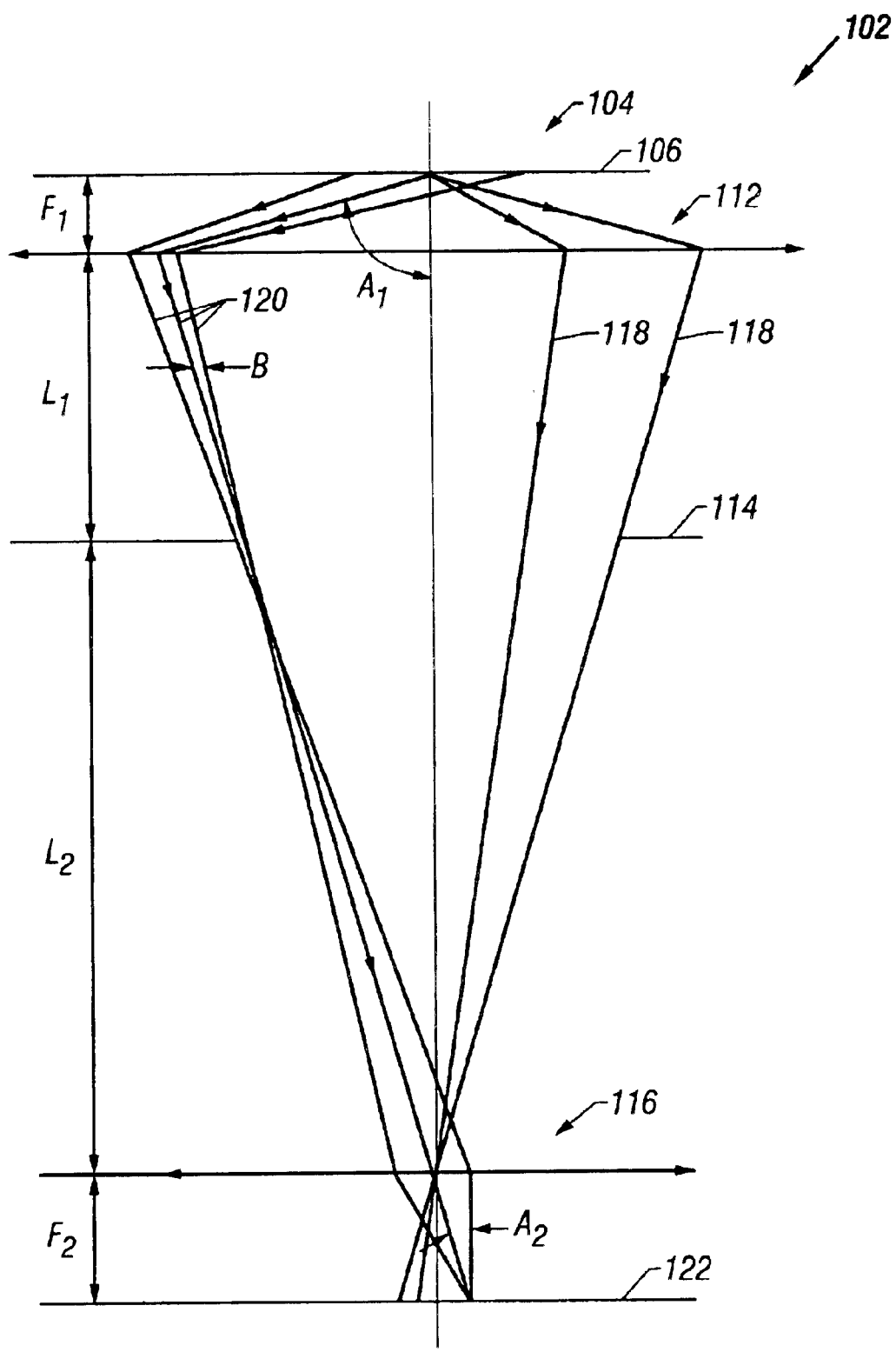
FIGS. 2A and 2B are ray diagrams of a focused ion beam column in accordance with an aperture imaging embodiment of the present invention.
Figure 2B:
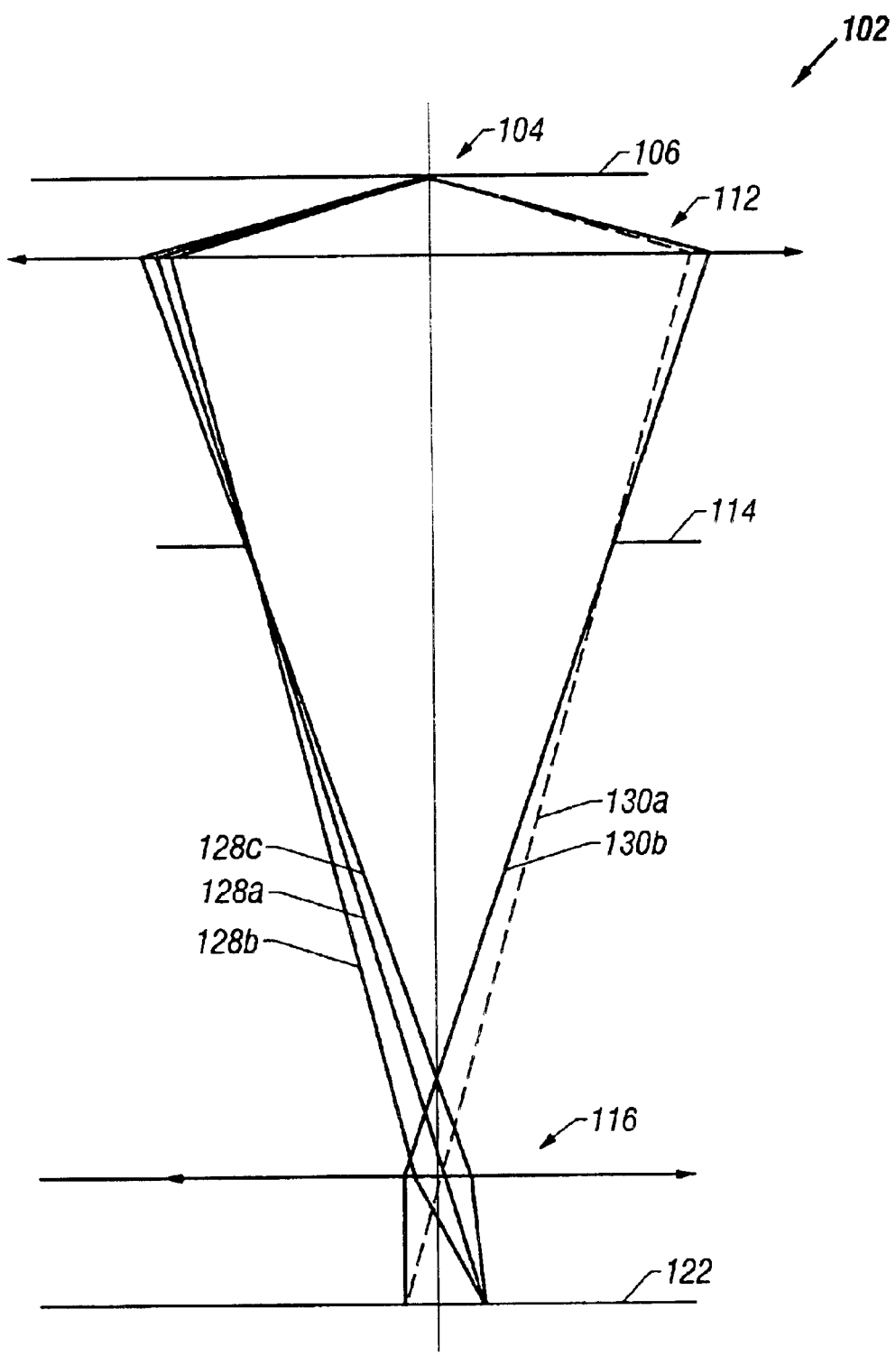

FIGS. 2A and 2B are ray diagrams of a focused ion beam column 102 in accordance with an aperture imaging embodiment of the invention. Ion column 102 includes a source 104 positioned on a source plane 106. A first ion lens 112 has a focal length $F_1$ and is positioned a distance $F_1$ from source plane 106. A shaping aperture 114 is positioned a distance $L_1$ from the plane of first lens 112, and a second lens 116 having a focal length $F_2$ is located a distance $L_2$ from shaping aperture 114. The magnification $M_1$ of the source by first lens 112 is therefore $(L_1+L_2)/F_1$ and the magnification of the shaping aperture by second lens 116 is $F_2/L_2$. In one embodiment, $L_1$ is 35 mm, $L_2$ is 400 mm, $F_1$ is 25 mm, $F_2$ is 10 mm, giving an $M_1$ of 17 and an $M_2$ of 0.025.

The ion column described above provides an enlarged ion beam having a uniform current density at a target plane. The beam forms a reduced, that is, demagnified, image of the aperture at the target surface, the image having a high edge resolution value, that is, sharp or small edge widths. In other words, the impact spot of the ions is in the shape of the aperture, with the ion bombardment rate being substantially uniform throughout the spot and dropping sharply to zero at the edge of the spot. Edge resolution of a shaped or unshaped beam can be characterized in various ways, one way being the distance over which the beam current density falls from eighty-five percent of its maximum value to fifteen percent of that value. High edge resolution is, for many applications, edge resolution on the order of a few tenths of microns or less, preferably less than one tenth of a micron, and more preferably less than fifty nanometers. We describe below the factors that determine the edge resolution in the aperture imaging embodiment. The sharpness of the beam edge corresponds to the edge width, W, of the image formed by the beam. A small edge width corresponds to a sharp edge and high resolution. The six primary factors that contribute to the edge width, W, are: the edge roughness of shaping aperture 114, the spherical aberration of second lens 116, the chromatic aberration of second lens 116, the diffraction of second lens 116, the interaction of ions within the beam, and the geometric aberration due to the extended source. The contribution to the edge width from each of these factors is referred to as $W_A$, $W_S$, $W_C$, $W_D$, $W_B$, and $W_G$, respectively. As will be shown below, the extended source contribution is essentially zero in the two-lens column described above, so the image edge width is equal to $W=(W_C^2+W_S^2+W_D^2+W_A^2+W_B^2)^{0.5}$ Each of these factors is described below to teach skilled persons how to vary the optical elements to make and use other embodiments of the invention suitable for different applications.

The half-angle spread, $A_2$, of ions leaving second lens 116 is a factor in determining the contributions to the edge width of spherical aberration ($W_S$), chromatic aberration ($W_C$), and diffraction ($W_D$). The angular spread $A_2$ is equal to the incoming angular spread, B, divided by the magnification $M_2$. FIGS. 2A and 2B show factors contributing to the angular spread B.

The right hand side of FIG. 2A shows that rays 118 originating from a point in the center of ion source 104 and propagating in different directions are being imaged to the same point at the center of second lens 116 if no lens aberrations are present. The left hand side of FIG. 2A shows that rays 120 originating from different points along source 104 and grazing shaping aperture 114 pass through second lens 116 at different points, thereby widening the beam at second lens 116. Because second lens 22 is positioned to form an image of aperture 114 on a target plane 122, rays 120 are focused to a single point (assuming no aberrations from the second lens), and the direct contribution to the edge width from the extended source ($W_G$) is zero. The extended source does, however, contribute to the angular spread, B, of ions entering second lens 116.

FIG. 2B shows the effects of chromatic and spherical aberrations on the rays originating from the center of the source. Rays 128a, 128b, and 128c on the left side of FIG. 1B show the effects of chromatic aberration, with ray 128a having the nominal beam energy E, ray 128b having energy E+dE, and ray 128c having energy E−dE. In one embodiment, E is 30,000 V and dE is 5V. Rays 130a and 130b on the right side of FIG. 2B show the effects of spherical aberration, with ray 130a showing the path of a first order ray, and ray 130b showing the actual path of a ray having spherical aberration. Quantitatively, the angular spread B is determined as:

$$B=(B_G^2+B_C^2+B_S^2)^{0.5} \qquad \text{Eq. 1}$$

where $B_G$, the angular spread due to the source size, Bc, the angular spread due to chromatic aberration, and Bs, the angular spread due to spherical aberrations are equal to:

$$B_G=r_G/F_1 \qquad \text{Eq. 2}$$

$$B_C=r_C/F_1=C_{C1}A_1\,e/F_1 \qquad \text{Eq. 3}$$

$$B_S=C_{S1}A_1^3/F_1 \qquad \text{Eq. 4}$$

in which $r_G$ is source radius, $r_C$ is chromatic radius, $C_{C1}$ is the coefficient of chromatic aberration of first lens 112, and $C_{S1}$ is the coefficient of chromatic aberration of first lens 112. Typical values for the parameters used to determine B are shown below in Table 1:

TABLE 1

| | |
|---|---|
| $C_{C1}$ = | 100 mm |
| $C_{S1}$ = | 500 mm |
| $F_1$ = | 25 mm |
| $F_2$ = | 10 mm |
| $r_G$ = | 0.05 mm |
| $R_C$ = | 25 nm |

Thus, chromatic and spherical aberrations of first lens 112 both contribute to the angular spread B, which is typically small, on the order of $10^{-4}$ or less radians when $A_1$ is less than 0.02 radians and dE/E=5/30,000.

The spherical and chromatic aberration of second lens 116 also contribute directly to the beam edge width. The contribution from the chromatic aberration, $W_C$, is $C_{C2}A_2$ dE/E and the contribution to the edge width from the spherical aberration, $W_S$, is $=C_{S2}A_2^3$, with $C_{C2}$ being, in one embodiment, 100 mm and $C_{S2}$ being 500 mm, as given in Table 1.

$W_D$, the contribution to the image edge width by diffraction, depends upon the wavelength and the second lens 116 entrance angle $A_2$. $W_D$, is typically the smallest of the five factors because the wavelengths of the ions are small and because the angle $A_2$, which depends on the angular spread, B, is also small. For example, if $L_2$ is 200 mm and $B=10^{-4}$ radians, the beam diameter in second lens 116 is 20 μm, corresponding to a small angle $A_2$, on the order of $10^{-3}$ radians for $A_1$ less than $10^{-3}$ radians.

$W_A$, the contribution to the image edge width due to the demagnified aperture edge roughness is the dominant contribution. Using electroetched apertures, the best edge roughness readily attainable is about two microns. With an $M_2=\frac{1}{10}$, this gives $W_A=0.2$ μm, which is orders of magnitude greater than all other contributions to the edge width except the beam interaction contribution. Silicon or other semiconductor fabricated materials could be used for the aperture and would provide a much smoother edge and, therefore, much better edge resolution. The edge of such apertures, however, would be rapidly milled away by the ion beam and frequent aperture changes would be necessary.

$W_B$, the edge width contribution from beam interactions, is another large contribution. The beam interaction contribution is caused by ions in the beam repelling each other, particularly at points where the beam is narrowed over an extended distance. Beam interactions are a concern in this column design because the rays cross over in the center of second lens 116, and the beam angle, B, is very shallow. Fortunately, the effect of the beam interactions on edge width is reduced because the crossover is late in the column.

An analysis of the beam interactions for the beam focused by first lens 112 to the plane of second lens 116 indicates that the minimum rms blur including the bean interactions is 3.12 $\mu$m, whereas the minimum rms blur not taking into account beam interaction is 2.74 $\mu$m. If the beam interaction blur can be considered to add quadradically, then the beam interaction portion is $$D_B = (3.12^2 - 2.74^2)^{0.5} = 1.49 \ \mu m \qquad \text{Eq. 5}$$

for the beam focused by the first lens to the plane of the second lens. One method of determining the contribution of the beam interactions to the final beam edge width is to estimate what deviation these rays have when extrapolated back to the aperture. Assume that the deviation of individual particles from straight lines has column length dependence as follows:

$$D_b = K \ Z^N \qquad \text{Eq. 6}$$

where Z is the beam interaction length and K and N are parameters. Differentiating to get the slope of the ray at distance Z gives:

$$dD_b/dZ = N \ K \ Z^{N-1} \qquad \text{Eq. 7}$$

Then the ray deviation extrapolated back to Z=0 is $$D_{b0} = (dD_b/dZ)Z - D_b = (N-1)D_b \qquad \text{Eq. 8}$$

W. Stickel, in "Simulation of Coulomb Interactions in electron Beam Lithography Systems—A Comparison of Theoretical Models", Papers from the 42$^{nd}$ International Conference on Electron, Ion, and Photon Beam Technology and Nanofabrication, 26–29 May 1998, Chicago, Ill., suggests that N=1.4, and in this case, $$D_{b0} = 0.4 \ D_b = 0.6 \ \mu m \qquad \text{Eq. 9}$$

Thus, the 0.6 $\mu$m contribution to the edge width from the beam interactions is less than the 2 $\mu$m from the aperture edge roughness. However, this estimate is low, as the beam interactions are stronger as the beam converges near second lens 116, and extrapolating the orbits back to the aperture will then have a larger contribution. In addition, the approximation developed here is rough in that an ion orbit is assumed to be perturbed from only one direction throughout the orbit.

The contribution due to beam interactions in the shaped beam mode can be reduced by focusing the beam from first lens 112 slightly beyond the plane of second lens 116. This would increase the beam diameter in second lens 116 and thereby decrease beam interactions. Second lens 116 aberrations would increase, but this could be tolerated as the column has extremely low spherical and chromatic aberration to begin with. These small aberrations from lens 2 result from the small beam size in the plane of the second lens 116.

As described, the resulting edge resolution can be made sufficiently small using the aperture imaging embodiment to create a FIB having excellent edge resolution. This embodiment also provides a uniform current density. Table 2 gives various parameters described above as a function of the first lens 112 half-angle, $A_1$. This table was calculated using the parameters of Table 1. The beam current in the last column of Table 2 is calculated using a source angular intensity of 20 microamps per steradian.

TABLE 2

| $A_1$ (rad) | $M_1$ | $B_G$ (rad) | $B_C$ (rad) | $B_S$ (rad) | B (rad) | $M_2$ | $A_2$ (rad) | $W_C$ (um) | $W_S$ (um) | $W_D$ (um) | $W_A$ (um) | $W_B$ (um) | W (um) | Ib (nA) |
|---|---|---|---|---|---|---|---|---|---|---|---|---|---|---|
| 0.002 | 17.00 | 2.0E-06 | 1.3E-06 | 1.6E-07 | 2.4E-06 | 0.025 | 9.6E-05 | 1.6E-06 | 4.5E-10 | 2.1E-04 | 5.0E-02 | | 0.05 | 0.628 |
| 0.004 | 17.00 | 2.0E-06 | 2.7E-06 | 1.3E-06 | 3.6E-06 | 0.025 | 1.4E-04 | 2.4E-06 | 1.5E-09 | 1.4E-04 | 5.0E-02 | | 0.05 | 2.512 |
| 0.006 | 17.00 | 2.0E-06 | 4.0E-06 | 4.3E-06 | 6.2E-06 | 0.025 | 2.5E-04 | 4.1E-06 | 7.7E-09 | 8.0E-05 | 5.0E-02 | | 0.05 | 5.652 |
| 0.008 | 17.00 | 2.0E-06 | 5.3E-06 | 1.0E-05 | 1.2E-05 | 0.025 | 4.7E-04 | 7.8E-06 | 5.1E-08 | 4.3E-05 | 5.0E-02 | | 0.05 | 10.048 |
| 0.010 | 17.00 | 2.0E-06 | 6.7E-06 | 2.0E-05 | 2.1E-05 | 0.025 | 8.5E-04 | 1.4E-05 | 3.0E-07 | 2.4E-05 | 5.0E-02 | | 0.05 | 15.700 |
| 0.012 | 17.00 | 2.0E-06 | 8.0E-06 | 3.5E-05 | 3.6E-05 | 0.025 | 1.4E-03 | 2.4E-05 | 1.4E-06 | 1.4E-05 | 5.0E-02 | | 0.05 | 22.608 |
| 0.014 | 17.00 | 2.0E-06 | 9.3E-06 | 5.5E-05 | 5.6E-05 | 0.025 | 2.2E-03 | 3.7E-05 | 5.5E-06 | 9.0E-06 | 5.0E-02 | | 0.05 | 30.772 |
| 0.016 | 17.00 | 2.0E-06 | 1.1E-05 | 8.2E-05 | 8.3E-05 | 0.025 | 3.3E-03 | 5.5E-05 | 1.8E-05 | 6.1E-06 | 5.0E-02 | | 0.05 | 40.192 |
| 0.018 | 17.00 | 2.0E-06 | 1.2E-05 | 1.2E-04 | 1.2E-04 | 0.025 | 4.7E-03 | 7.8E-05 | 5.2E-05 | 4.3E-06 | 5.0E-02 | | 0.05 | 50.868 |
| 0.020 | 17.00 | 2.0E-06 | 1.3E-05 | 1.6E-04 | 1.6E-04 | 0.025 | 6.4E-03 | 1.1E-04 | 1.3E-04 | 3.1E-06 | 5.0E-02 | | 0.05 | 62.800 |
| 0.022 | 17.00 | 2.0E-06 | 1.5E-05 | 2.1E-04 | 2.1E-04 | 0.025 | 8.5E-03 | 1.4E-04 | 3.1E-04 | 2.3E-06 | 5.0E-02 | | 0.05 | 75.988 |
| 0.024 | 17.00 | 2.0E-05 | 1.6E-05 | 2.8E-04 | 2.8E-04 | 0.025 | 1.1E-02 | 1.8E-04 | 6.8E-04 | 1.8E-06 | 5.0E-02 | | 0.05 | 90.432 |
| 0.026 | 17.00 | 2.0E-06 | 1.7E-05 | 3.5E-04 | 3.5E-04 | 0.025 | 1.4E-02 | 2.3E-04 | 1.4E-03 | 1.4E-06 | 5.0E-02 | | 0.05002 | 106.132 |
| 0.028 | 17.00 | 2.0E-06 | 1.9E-05 | 4.4E-04 | 4.4E-04 | 0.025 | 1.8E-02 | 2.9E-04 | 2.7E-03 | 1.1E-06 | 5.0E-02 | | 0.05007 | 123.088 |
| 0.030 | 17.00 | 2.0E-06 | 2.0E-05 | 5.4E-04 | 5.4E-04 | 0.025 | 2.2E-02 | 3.6E-04 | 5.0E-03 | 9.3E-07 | 5.0E-02 | | 0.05026 | 141.300 |

Notice that B is very small; that is, the beam fills second lens 116 with a very small beam diameter (For $L_2$=200 mm and B=10$^{-4}$ radians, the beam diameter in second lens 116 is only twenty microns), and $A_2$ is correspondingly very small. In treating the aberrations of second lens 116, diffraction is considered as part of our calculation of the shaped beam edge width, W. However, diffraction is still the smallest contribution among the five contributing terms.

The embodiment described above has the advantage that the shaped beam size is relatively independent of focus. The size of the shaped beam however, is relatively inflexible because the shaped beam forms an image of the aperture on the target plane and the size of the beam on the target plane is determined, therefore, by the size of the aperture and the demagnification from the aperture to the target plane. This embodiment is best suited for large, that is, tens of microns, sized beams. This is because a small aperture, which must be placed in a more dense beam, is quickly destroyed by that beam and a longer column to produce higher demagnification would adversely affect edge resolution by increasing beam interaction effects. Also, the range of useful aperture sizes is limited, because of the aperture edge width contribution, about two microns, from the electroetched apertures. If a square aperture is two hundred microns on a side, then the edge roughness is only one percent. A twenty micron aperture, however, would have ten percent edge roughness, and one hundred times less current would go through one aperture. A twenty micron aperture could be fabricated from silicon, but it must be placed in a smaller, denser beam, and will erode very rapidly. Aperatures of various shapes can be used, depending on the application requirements.

Based on the description above of the embodiment and of the theory underlying the embodiment, skilled persons will be able to vary the characteristics of the lens, the distances between elements, and the aperture size and shape to produce a shaped beam suitable for their particular application.

Defocusing Embodiment

A second embodiment of the invention is referred to the "defocusing" embodiment. Applicants have discovered that if the chromatic aberration dominates over spherical aberration, a strongly underfocused ion beam will have a relatively uniform current density, and a straight-sided aperture in the beam path of such a beam will result in a beam having straight sides and sharp edges. In other words, a square or rectangular aperture placed in the beam path, preferably in the vicinity of the final lens, in combination with the strong under-focusing will generate a square or rectangular beam.

Figure 3:
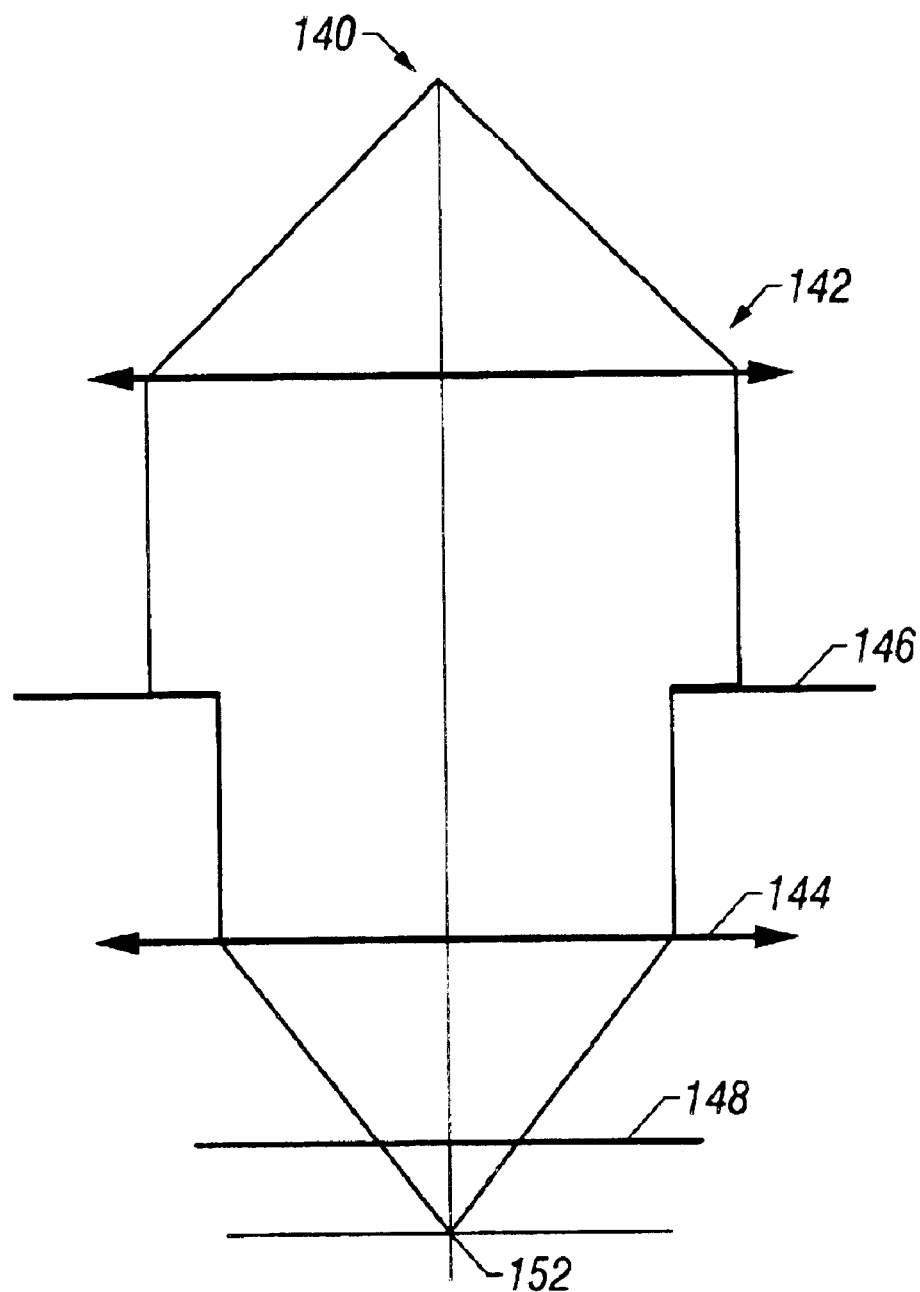
FIG. 3 is a ray diagram of a defocus embodiment for forming shaped beams.
Figure 4A:
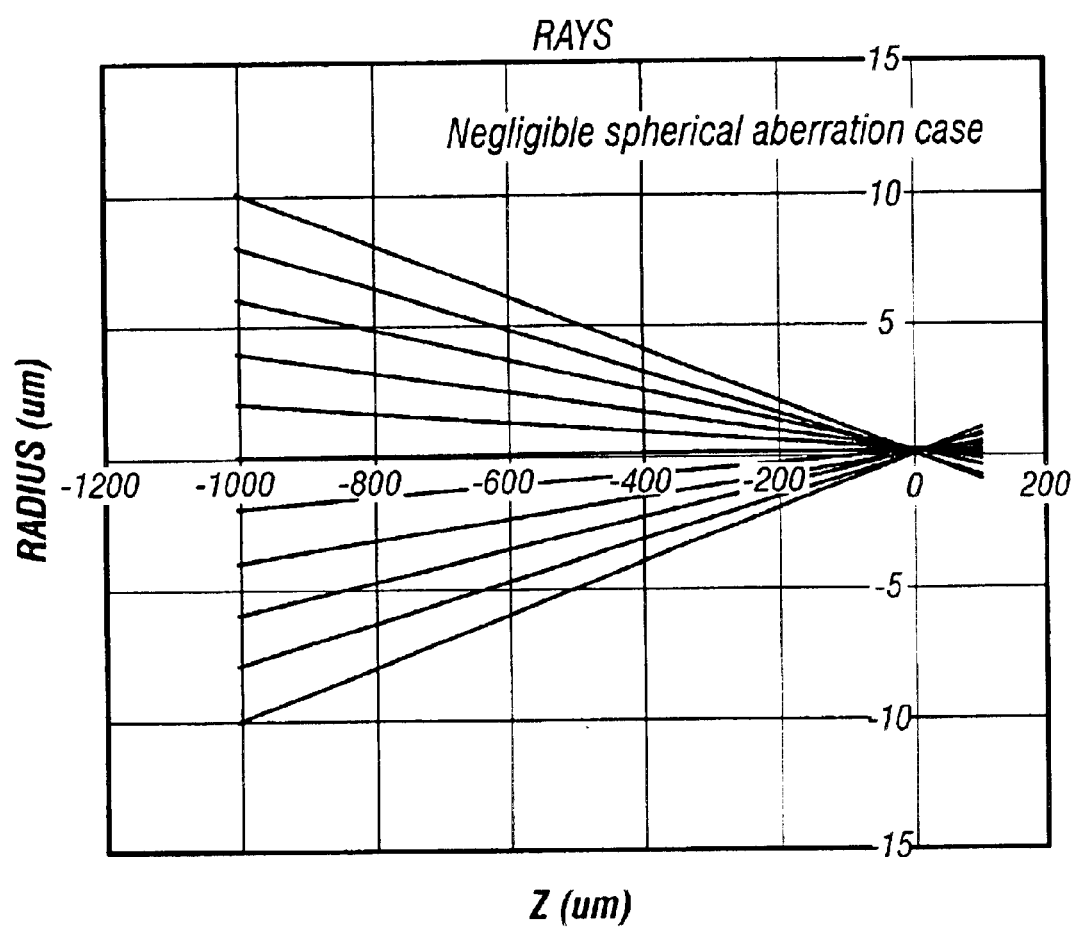
FIGS. 4A and 4B are diagrams of rays emitted from a final lens toward a target, FIG. 4A showing rays without aberrations.
Figure 4B:
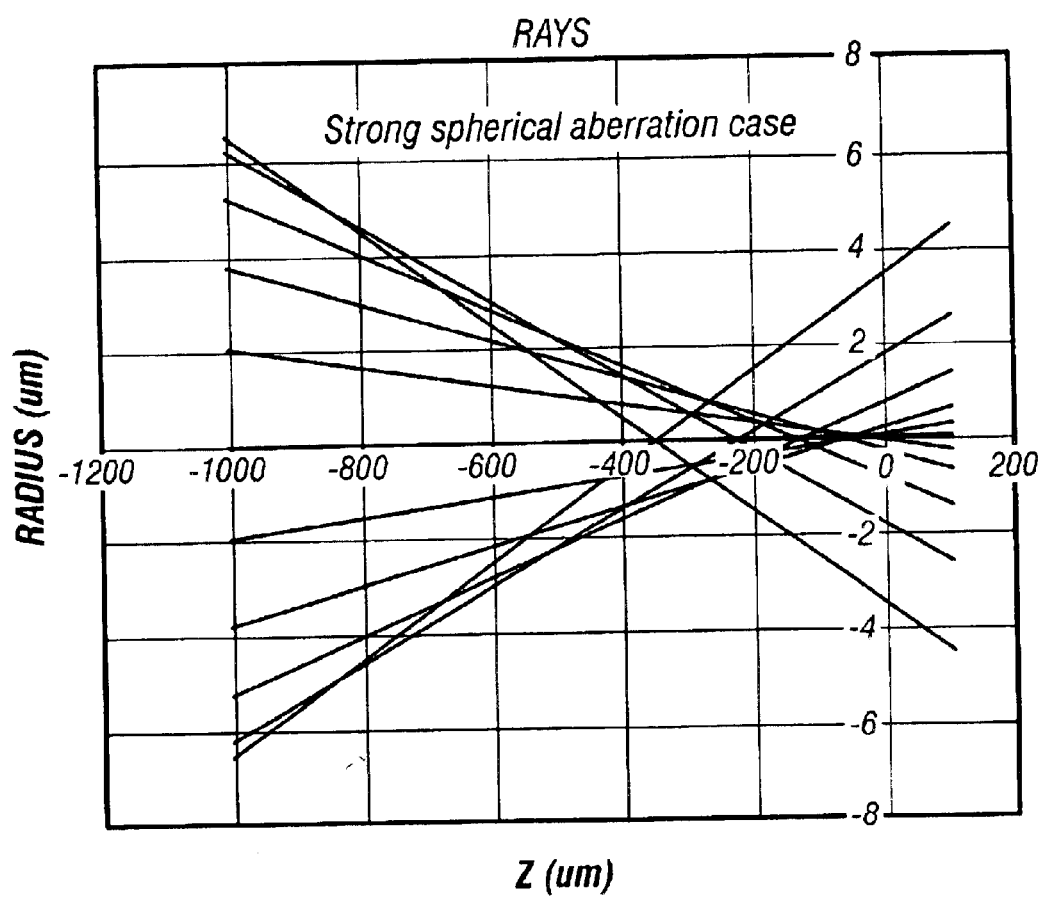

The defocusing embodiment uses a two lens column with a shaping aperture, and underfocuses the ion beam, an embodiment of which is shown in FIG. 3. FIG. 3 shows an ion source 140, a first lens 142, a second lens 144, and a beam shaping aperture 146. The target is located in target plane 148. FIG. 3 also shows that second lens 144 converges ions onto a crossover point 152 below target plane 148. Even though the column may have substantial spherical aberration contribution, in this large under-focus condition, the beam is still relatively uniform in current density. A beam is "strongly" underfocused if the current density of the aberrated beam is relatively uniform throughout its cross section. The degree of underfocus that is "strong" in any particular column will depend upon the design of the ion column. In a typical ion column, a strongly underfocused beam is, in most cases, focused at least 100 $\mu$m beyond the target plane and preferably at least 500 $\mu$m beyond the target plane. FIGS. 4A and 4B are ray diagrams showing rays, originally emitted from a point source, emerging from a final lens toward a target. FIG. 4A shows rays 158 without aberrations, the rays converging to a point on a crossover plane. FIG. 4B shows rays 160 having substantial spherical aberrations. Rays 160 do not converge to a single point, as most of rays 160 cross the optical axis before reaching the target plane. In the case of FIG. 4A, if the source emits the charged particles in a uniform angular distribution, and Z=0 is defined as the beam cross over plane, then a plane placed a distance Z from the crossover plane will have uniform current density over the beam. In other words, if a target is placed at some negative or positive Z position, the beam will be uniform over its full diameter. On the other hand, the spherical aberrated beam in FIG. 4B has a non-uniform current density, and for large negative Z, the rays tend to bunch up at the beam edges. At a smaller negative Z, there is a minimum beam diameter location 162, called the disk of least confusion, at which the spherical aberrations produce non-uniformities over the entire beam.

Figure 5A:
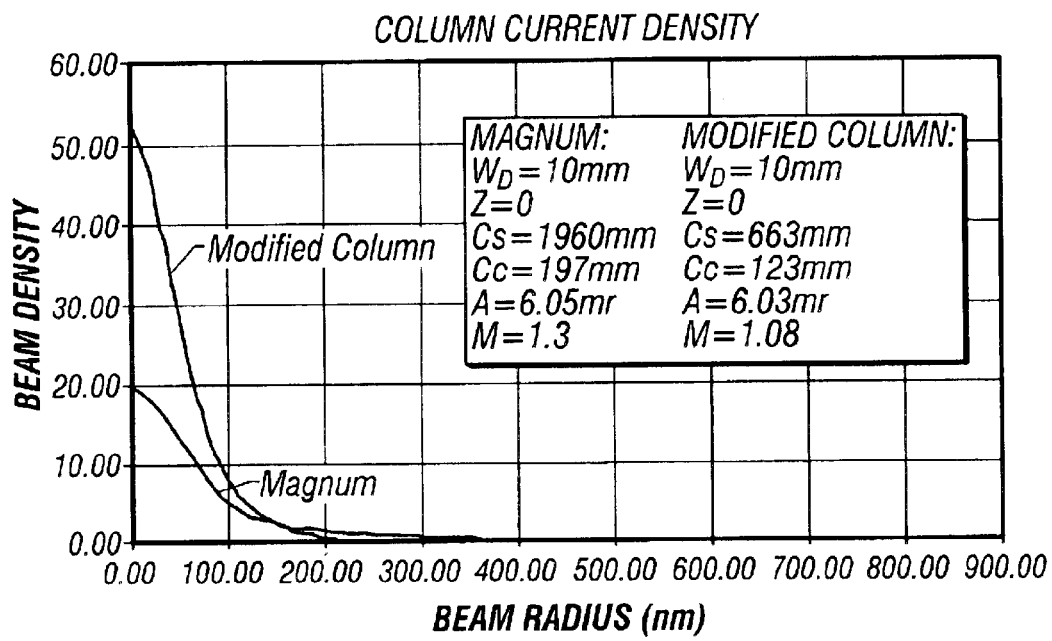
FIGS. 5A, 5B, and 5C are graphs showing current density profiles across a focused ion beam at various target positions.
Figure 5B:
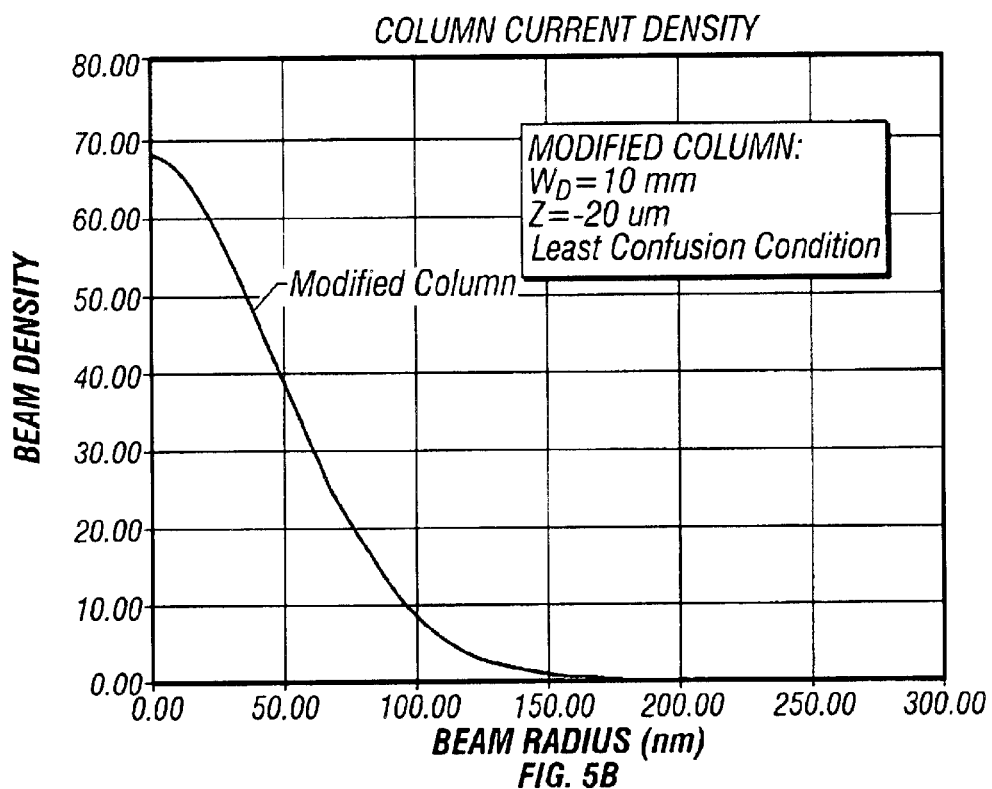
Figure 5C:
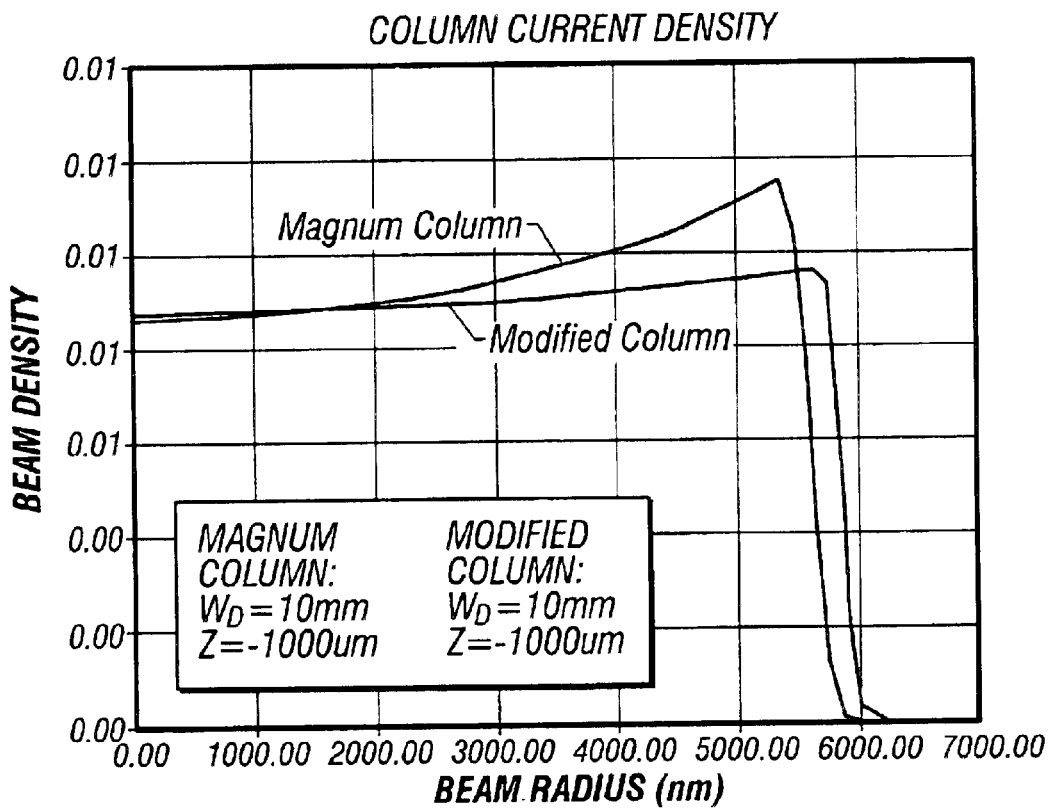

FIGS. 5A, 5B, and 5C show the calculated current density across unshaped (round) ion beams. FIG. 5A shows the ion beam current density at a target placed at Z=0 for a Magnum model FIB column manufactured by FEI Company, the assignee of the present invention and for a modified column that uses lenses having smaller focal lengths to reduce spherical aberration. As is known in the art, spherical aberration is reduced by reducing the focal lengths, using lenses having wider bores, and using higher lens voltages. The modified lens has a focal length of about 20 mm for both the first and second lenses. FIG. 5B shows the current density at a target placed at the disk of least confusion at Z=−20 $\mu$m for the modified column.

The current densities are determined as described in "A Method for Calculating the Current Density of Charged Particle Beams and the Effect of Finite Source Size and Spherical and Chromatic Aberrations on the Focusing Characteristics", M. Sato and J. Orloff, Jour. Vacuum Sci. and Technol. B 9(5), September/October, 2609 (1991) and "Experimental Study of a Focussing Ion Beam Probe Size and Comparison with Theory", J. Orloff, J.-Z. Li, and M. Sato, Jour. Vacuum Sci. and Technol. B 9(5), September/October, 2609 (1991). FIGS. 5A and 5B have strong peaks in the current density and gaussian-like peak shapes or beam profiles. These types of beams have traditionally been employed in FIB systems.

FIG. 5C shows the current density at a target position having large underfocus or large negative Z (−1,000 $\mu$m), where the beam is relatively uniform in current density. FIG. 5C for the large under-focus condition shows a relatively uniform current density over a large beam diameter with some increase in current density at the edges. Even though the column has substantial spherical aberration contribution, in this large under-focus condition, the beam is still relatively uniform in current density. FIG. 5C shows that a square or rectangular aperture placed in the vicinity of the final lens in combination with the strong under-focusing will generate a square or rectangular beam.

Figure 6:
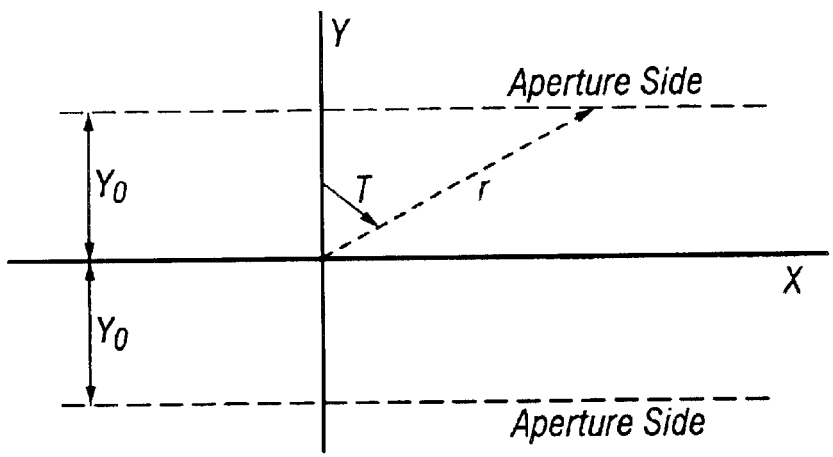
FIG. 6 shows a straight aperture edge cutting off the beam along side the optical axis.

A beam is chromatic aberration limited if other sources of aberration are small compared to the chromatic aberration, that is, the chromatic aberration is the most significant factor preventing the ion beam from focusing to an ideal, first order image. As is shown below, if the beam is chromatic aberration limited, the shaped beam will have high edge resolution, that is, sharp edges or small edge widths. The chromatic aberration broadens the beam in proportion to the lens angle A, whereas the magnified source contribution is independent of A. In the geometric optics approximation, the beam radius including chromatic aberration and under- or over-focusing is $$R_C=(C_C(dE/E)+Z)A \qquad \text{Eq. 10}$$

where $R_C$ is the chromatic radius, $C_C$ is the chromatic aberration coefficient, dE/E is the normalized energy spread, and Z is the image plane distance away from the first order focal plane (positive Z is in the direction away from the final lens). FIG. 6 shows a straight aperture edge cutting off the beam along two sides of the optical axis, which is perpendicular to the plane of the paper. As shown in FIG. 6, $$r=Y_0/\cos(T) \qquad \text{Eq. 11}$$

$$A=k \ r=k \ Y_0/\cos(T) \qquad \text{Eq. 12}$$

$$A=A_0/\cos(T) \qquad \text{Eq. 13}$$

in which $Y_0$ is the distance of the straight, parallel aperture edges from the optical axis, k is a constant, T and r are variables used to describe different positions along the aperture edge, and $A_0$ is the lens angle as determined by the aperture width.

Then the Y-direction chromatic contribution perpendicular to the parallel edges is given by:

$$R_{CY}=R_C \cos(T)=C_C(dE/E)A_0 \qquad \text{Eq. 14}$$

Because the cosines cancel out, $R_{CY}$ is independent of T (or X), so the straight, parallel aperture sides give constant chromatic contribution in the Y-direction for the beam limited by the straight aperture edges. The chromatic aberration is proportional to the aperture size $Y_0$ in FIG. 6.

Since the magnified source is cylindrically symmetric in T, its contribution adds in the Y-direction with no X-dependence, and Equation 14 can be rewritten to include the modified source radius for the Y-direction as $$W_Y=Z\,A_0 \qquad \text{Eq. 15}$$

and $$dW_Y=(C_C(dE/E)A_0)^2+(2\,M\,R_G)^2)^{1/2} \qquad \text{Eq. 16}$$

where $W_Y$ is the beam half-width in the Y direction, and $dW_Y$ is the beam edge width in the Y-direction, and it is assumed that the beam is strongly under-focused (Z<<0). The source contribution of Equation 16 arises from the source being convoluted with a flat beam density having chromatic aberrated edges. The source contribution to the radius is its diameter-hence the factor of 2. Thus the, straight, parallel aperture sides yield straight beam edges with constant chromatic and source contributions in the Y-direction for X from zero to infinity.

Referring again to FIG. 3, the beam shaping aperture is shown placed before the final lens, though it could be placed before the first lens or elsewhere. If a straight aperture edge is placed in the X-direction a distance $Y_0$ from the beam optical axis in the Y-direction, then there is an angle $A_0$ of the beam in the Y-direction, which defines the chromatic aberration all along the X direction of the shaped beam independent of X. In other words, the beam cut by the straight aperture has a constant edge resolution. If a rectangular aperture is employed, then each side has a constant but different edge width, each width being defined by its $Y_0$ value and corresponding $A_0$ value. A special case is where a square aperture is symmetrically placed about the beam axis, in which case all sides have the same edge resolution. A useful case for the rectangular aperture is where a slot must be cut with the ion beam, and a long, thin rectangular aperture can form a long, thin beam, with the long sides having sharper edges than the short sides.

Equations similar to Equations 15 and 16 can be derived for significant spherical aberration in the column by those skilled in the art. The aperture in this case can be shaped along its edges to give a straight edged beam.

Equation 15 shows that the size of the shaped beam is proportional to $A_0$ and the defocus distance Z. Thus accurate setting of the target plane with respect to the final lens is important. Typically this setting must be to within a few microns in Z, which can be accomplished using, for example, a capacitance distance measuring device, such as manufactured by ADE Technology of Newton, Mass.

Center Cut Aperture Variation

A special case, referred to as the Center Cut Aperture Variation of the defocusing embodiment, arises when a straight aperture edge is placed through the column optical axis. Referring to Equation 16, it is seen that in this case $A_0$=0, and the chromatic term in the edge width becomes zero. This can also be shown for spherical aberration. Thus a center cut straight aperture has the property that spherical and chromatic aberration do not contribute to the edge resolution of the beam. Remaining contributions to the beam resolution along this edge include the magnified source (See Equation 16) and the beam interactions. Thus this method can be employed to sharpen a beam edge, though at the cost of reducing beam current.

Applications

Figure 7:
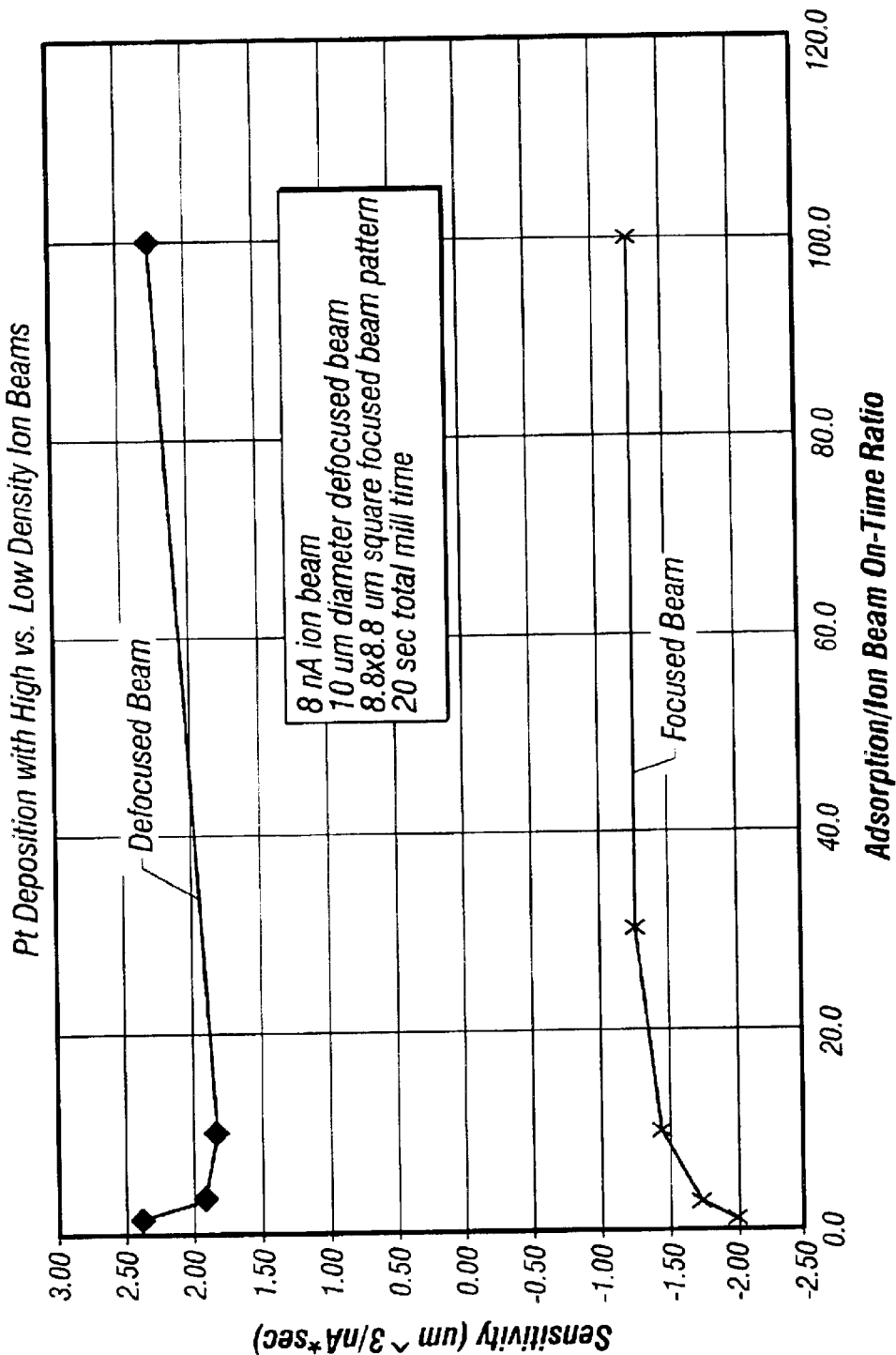
FIG. 7 is graph comparing the platinum deposition by the present invention and the prior art.

Low density ion beams can be useful for FIB processing, where the ion beam and a gas jet are coincident upon the surface, to either enhance the etching or deposition of material on the surface. In some of these applications, a prior art ion beam depletes the adsorbed gas so fast that the chemistry is less effective. Either of these shaped beam methods can be used in these applications to increase the process efficiency. An experimental example is shown in FIG. 7, where platinum deposition speed is greatly increased using the defocus method to produce a less dense, shaped beam. In this particular example employing an 8 nA ion beam current, the deposition actually goes from negative (milling the surface) to positive (deposition). This increased efficiency can give about 50 times increase in deposition throughput over normal deposition conditions using a less dense, lower current beam.

Other ways to apply the shaped beams are similar to electron beam lithography, where square or rectangular beams can be "stitched" together to form larger patterns. As in electron beam lithography, an array of edges or apertures can be rapidly switched by mechanical or electrical (beam steering) means to mix and match beam strategies on the fly.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of using a focused beam of ions to deposit material onto a target or to remove material from a target, comprising:

extracting ions from an ion source;

forming the ions into a non-Gaussian, shaped ion beam having a current density that is uniform ad sufficiently low to reduce overmilling;

providing a target;

directing a jet of working material towards the target; and directing the ion beam toward the target, the ions in the beam inducing a reaction of the working material to deposit material onto the target or to remove material from the target.

2. The method of claim 1 in which forming the ions into a non-Gaussian, shaped beam comprises:
- with a first lens, forming an image of the ion source onto a second lens;
- passing the ions through an aperture; and
- with the second lens, forming an image of the aperture onto the target.

3. The method of claim 1 in which forming the ions into a non-Gaussian, shaped beam comprises:
- passing the ions through an aperture; and
- strongly underfocusing the ion beam to produce a uniform current density at the target surface.

4. The method of claim 1 in which forming the ions into a non-Gaussian, shaped ion beam includes forming the ions into a beam having a current greater than that of an unshaped beam, thereby depositing or removing material faster than an unshaped beam without depleting the working material.

5. The method of claim 1 in which the non-Gaussian, shaped ion beam is characterized in the target plane by a current density profile having a geometric feature with an edge resolution that is similar to that of the beam without shaping, thereby producing features on the target as fine as those produced by an unshaped beam.

6. The method of claim 1 in which directing the ion beam toward the target includes etching or depositing at the target a pattern corresponding to the shape of the ion beam and then stepping the ion beam to repeat the pattern.

7. The method of claim 1 in which forming a focused ion beam includes positioning a straight edge in the path of the ions near the beam center, thereby forming a shaped ion beam having at the target plane a straight edge with high edge resolution and producing on the target a feature having a straight edge.

8. The method of claim 1 in which directing a jet of working material towards the target includes directing a precursor gas and in which the reaction induced by the ion beam includes deposition of a conductive or an insulating material.

9. A focused ion beam system for irradiating a target positioned at a target plane, comprising:
- a vacuum system;
- an ion beam column positioned in the vacuum system for creating an ion beam for impinging upon a target, the ion beam column including high voltage, beam blanking and scanning electrodes and producing a non-Gaussian, shaped ion beam having an average current density that is substantially uniform at the target and that is sufficiently low to reduce overmilling;
- a secondary electron or ion detection and imaging system;
- a gas injection system for directing a jet of gas toward the impact point of the shaped ion beam on the target; and
- a controller for controlling the shaped ion beam to irradiate an area on the target to initiate a reaction by gas adhered to the target, the reaction etching the target area or depositing a material onto the target area.

10. The focused ion beam system of claim 9 in which the shaped beam is characterized by a current density profile at the target plane and in which the current density profile exhibits at least one geometric feature having a high edge resolution.

11. The focused ion beam system of claim 9 in which the ion beam column includes an aperture and a lens for imaging the aperture upon the target.

12. The focused ion beam system of claim 9 in which the gas injection system includes a precursor gas for depositing a conductive or insulating material.

13. The focused ion beam system of claim 9 further comprising a straight edge positioned in the path of the beam near its center, thereby forming at the target plane an ion beam having a straight edge with high edge resolution that is substantially unaffected by chromatic and spherical aberration.

14. The focused ion beam system of claim 9 in which the ion beam column focuses the ion beam sufficiently beyond the target to provide a shaped ion beam of uniform current density at the target.

15. The focused ion beam system of claim 14 in which the ion beam column is substantially chromatic aberration limited.

16. The focused ion beam system of claim 14 in which the ion beam column includes an aperture having one or more straight edges and produces a beam including at least one sharply defined edges.

17. A focused ion beam system for irradiating a target positioned at a target plane, comprising:
- a vacuum system;
- an ion beam column positioned in the vacuum system for creating an ion beam for impinging upon a target, the ion beam column including high voltage, beam blanking and scanning electrodes and an aperture for producing a non-Gaussian, shaped ion beam image having a current density that is substantially uniform at the target, the ion beam column being shaped to focus the ion beam sufficiently beyond the target to provide the shaped ion beam of uniform current density at the target, wherein the aperture has a straight edge, and the chromatic aberration portion of the edge resolution of the image on the target is inversely related to the shortest distance of the straight aperture edge from the beam optical axis;
- a secondary electron or ion detection and imaging system;
- a gas injection system for directing a jet of gas toward the impact point of the shaped ion beam on the target; and
- a controller for controlling the shaped ion beam to irradiate an area on the target to initiate a reaction by gas adhered to the target, the reaction etching the target area or depositing a material onto the target area.

18. A method of producing a shaped ion beam, comprising:
- emitting ions from an ion source;
- forming an image of the ion source using a first lens, the image being formed substantially at a plane of a second lens;
- passing the ion beam through an aperture between the first lens and the second lens; and
- forming using the second lens an image of the aperture onto a target surface the image having a current density sufficiently low to reduce overmilling, thereby producing on the target surface an ion impact area having the shape of the aperture.

19. The method of claim 18 in which forming an image of the aperture includes forming an image having a substantially uniform current density in the target plane.

20. A method of producing a shaped ion beam, comprising:
- emitting ions from an ion source;
- forming an image of the ion source using a first lens, the image being formed substantially at a plane of a second lens;
- passing the ion beam through an aperture between the first lens and the second lens; and forming, using the second lens, an image, with a substantially uniform current density, of the aperture onto a target surface, thereby producing on the target surface an ion impact area having the shape of the aperture, wherein the substantially uniform current density is reduced from the maximum current density of an unshaped ion beam from a comparable ion column.

21. An apparatus for producing a shaped ion beam, comprising:

an ion source;

a first lens;

a second lens defining a second lens plane, the first lens configured to form an image of the ion source at the second lens plane; and an aperture positioned between the first and second lens, the second lens configured to form an image of the aperture on a target plane the image having a sufficiently low current density to reduce overmilling.

22. A method of producing a shaped ion beam, comprising:

emitting ions from an ion source;

forming an ion beam from the emitted ions;

passing the ion beam through an aperture; and focusing the ion beam onto a focal plane significantly beyond a target plane to produce at the target plane a beam having a diameter or size significantly greater than the diameter that the beam would have at the focal plane and having an edge resolution not significantly degraded from that of the unshaped beam and having a current density sufficiently low to reduce overmilling.

23. The method of claim 22 in which the aperture is substantially rectangular.

24. The method of claim 23 in which the aperture comprises a knife edge positioned near the center of the beam thereby forming an ion beam having at the target plane a straight edge with high resolution that is substantially unaffected by chromatic and spherical aberration.

25. A method of producing a shaped ion beam, comprising:

emitting ions from an ion source;

forming an ion beam from the emitted ions;

passing the ion beam through a substantially rectangular aperture; and focusing the ion beam onto a focal plane significantly beyond a target plane to produce at the target plane a beam having a diameter or size significantly greater than the diameter that the beam would have at the focal plane and having an edge resolution not significantly degraded from that of the unshaped beam, wherein the ion beam has a current density at the target plane significantly reduced from that of a corresponding unshaped beam.

26. The method of claim 23 in which the ion beam has a substantially uniform current density at the target plane.

27. A method of producing a shaped ion beam, comprising:

emitting ions from an ion source;

forming an ion beam from the emitted ions;

passing the ion beam through a substantially rectangular aperture; and focusing the ion beam onto a focal plane significantly beyond a target plane to produce at the target plane a beam having a diameter or size significantly greater than the diameter that the beam would have at the focal plane and having an edge resolution not significantly degraded from that of the unshaped beam, wherein the focusing of the shaped ion beam is substantially limited by the chromatic aberration of the ion column.

28. An apparatus for producing a shaped ion beam, the apparatus comprising:

an ion source providing ions for forming an ion beam along an optical axis;

an aperture positioned after the ion source and restricting the ion beam;

a lens converging the ion beam to a crossover point substantially beyond a target plane such that the current density of the ion beam at the target plane is substantially uniform and has a current density sufficiently low to reduce overmilling.

29. The apparatus of claim 28 which the aperture comprises a straight edge near the optical axis to substantially reduce aberration.

* * * * *

UNITED STATES PATENT AND TRADEMARK OFFICE
CERTIFICATE OF CORRECTION

PATENT NO. : 6,949,756 B2 Page 1 of 1
APPLICATION NO. : 09/765806
DATED : September 27, 2005
INVENTOR(S) : Robert Gerlach et al.

It is certified that error appears in the above-identified patent and that said Letters Patent is hereby corrected as shown below:

On the Title Page changes are as follows:

Item (75) Inventors: Please change Inventor name "Karl D. van der Mast" to read -- Karel D. van der Mast --.

In the Specification, please change the following:

Column 3, line 32, please change "Thus the…" to read -- Thus, the --.

In the Claims, please change the following:

Column 14, line 59, please change "ad" to read -- and --.

Column 15, line 46, please change "an average" to read -- a --.

Column 16, line 27, please change "shaped" to read -- adapted --.

Column 16, line 51, please change "surface" to read -- surface, --.

Column 17, line 17, please change "plane" to read -- plane, --.

Column 18, line 12, please change "23" to read -- 25 --.

Signed and Sealed this

Sixth Day of May, 2008

JON W. DUDAS
*Director of the United States Patent and Trademark Office*